United States Patent [19]
Pfiester

[11] Patent Number: 5,426,315
[45] Date of Patent: Jun. 20, 1995

[54] THIN-FILM TRANSISTOR HAVING AN INLAID THIN-FILM CHANNEL REGION

[75] Inventor: James R. Pfiester, Austin, Tex.

[73] Assignee: Motorola Inc., Schaumburg, Ill.

[21] Appl. No.: 131,190

[22] Filed: Oct. 4, 1993

[51] Int. Cl.6 .................. H01L 27/01; H01L 27/12
[52] U.S. Cl. .......................... 257/66; 257/67; 257/351; 257/900; 257/903; 257/411
[58] Field of Search ............. 257/66, 67, 69, 74, 257/347, 350, 351, 369, 900, 903, 904, 411

[56] References Cited

U.S. PATENT DOCUMENTS

| | | | |
|---|---|---|---|
| 4,966,864 | 10/1990 | Pfiester | 437/191 |
| 5,083,190 | 1/1992 | Pfiester | 257/903 |
| 5,233,207 | 8/1993 | Anzai | 257/66 |
| 5,241,193 | 8/1993 | Pfiester et al. | 257/67 |
| 5,309,010 | 5/1994 | Kitajima | 257/351 |

FOREIGN PATENT DOCUMENTS

| | | | |
|---|---|---|---|
| 3-69168 | 3/1991 | Japan | 257/66 |

*Primary Examiner*—William Mintel
*Assistant Examiner*—Minhloan Tran
*Attorney, Agent, or Firm*—Jasper W. Dockrey

[57] ABSTRACT

A thin-film transistor having a thin-film channel region (20) inlaid in a recess (29) along the wall of a multi-layered insulating structure (14), and a gate electrode (12) electrically controlling current conduction in the thin-film channel (20) and separated therefrom by a gate dielectric layer (32). The multi-layered insulating structure (14) includes a spacing layer (28) which is withdrawn from the wall of the multi-layered insulating structure (14) and forms an inner wall of the recess (29). By residing in the recess (29), the thin-film channel region (20) is aligned to the multi-layered insulating structure (14) and the gate dielectric layer (32) separates exposed portions of the thin-film channel region (20) from the gate electrode (12). Thin-film source and drain regions (16, 18) are integral with the thin-film channel region (20) and are self-aligned to the multi-layered insulating structure (14).

17 Claims, 7 Drawing Sheets

THIN-FILM TRANSISTOR HAVING AN INLAID THIN-FILM CHANNEL REGION

FIELD OF THE INVENTION

This invention relates in general to semiconductor devices a process for fabricating semiconductor devices, and more particularly to a thin-film transistor, and to a process for fabricating a thin-film transistor.

BACKGROUND OF THE INVENTION

There is a continuing trend in the semiconductor industry to fabricate integrated circuits of increasing complexity. As the complexity of an integrated circuit increases, the costs associated with fabricating the integrated circuit also increase. In order to provide integrated circuit devices having increased functional capability while maintaining control over the costs associated with fabrication, more devices must be included on each semiconductor wafer.

In recent years, integrated circuit fabrication technology has achieved the ability to define circuit components having feature sizes in the sub-micron size range. For example, new photolithographic techniques have been developed using X-ray and pulsed-laser energy sources. Additionally, film deposition technology now exists which can form thin-films having a precisely determined metallurgical composition and thickness. Furthermore, thin-film etching techniques have been developed which are capable of selectively etching one metallurgical composition, while not substantially etching other metallurgical compositions present on the semiconductor substrate.

However, even with the marked advances in fabrication technology, achievement of the necessary packing density and cost control in the manufacture of modern integrated circuits requires further development of circuit designs. Integrated circuit designs which take advantage of the improved capability of present manufacturing technology can substantially reduce the amount of substrate area necessary to fabricate an individual integrated circuit. One important design technique for fabricating devices having a small surface area is to stack metal-oxide-semiconductor (MOS) transistors in a vertical arrangement. Typically, a first transistor is formed in the substrate, having source, drain, and channel regions in the substrate, and a gate electrode overlying the substrate surface. Then, a second transistor is formed in thin-film layers overlying the first transistor. By adding an additional electrical component to the device, the thin-film transistor increases the functional capacity of the device while not consuming additional surface area. Thin-film transistors are especially useful in CMOS logic devices. For example, a CMOS inverter can be fabricated from an N-channel transistor in the substrate and a P-channel load transistor in a thin-film layer overlying the N-channel transistor. CMOS inverters find application in a wide variety of integrated circuit devices. For example, cross-coupled CMOS inverters form the memory storage element of an SRAM memory device.

Although thin-film transistors represent a useful design improvement for the formation of complex integrated circuits, their incorporation into integrated circuits presently requires that additional surface area be provided for the various components of the thin-film transistor. Further, thin-film transistors increase the topographic contrast of an integrated circuit device. Because thin-film transistors require additional layers, which must be formed over existing structures on the substrate surface, the total vertical height of the device is increased. The steep topography of the device can result in the formation of voids in metal leads subsequently formed to connect the device with external circuit elements. Accordingly, new designs which take full advantage of available fabrication technology are necessary to meet the need for high density semiconductor devices.

SUMMARY OF THE INVENTION

In practicing the present invention there is provided a thin-film transistor and a process, which in one form, can be fully self-aligned to an existing substrate transistor. A highly compact, thin-film transistor architecture is achieved by the arrangement of an inlaid thin-film channel region in a multi-layered insulating structure, and thin-film source and drain regions overlying edge portions of the multi-layered insulating structure. The thin-film transistor includes a thin-film channel region residing in a recess formed within multi-layer insulating structure. In one embodiment, the multi-layer insulating structure overlies a semiconductor substrate and has a substantially vertical side. A thin-film channel region resides substantially within a recess in the vertical side of the multi-layered body. Thin-film source and drain regions overlie first and second portions of the vertical side and are electrically connected to the thin-film channel region. A gate electrode lies intermediate to the source and drain region and is separated from the thin-film channel region by a gate dielectric layer. The thin-film transistor of the present invention can include a gate electrode positioned either above or below the thin-film channel region.

A process for fabricating the thin-film transistor of the invention includes the formation of recess in a multi-layered insulating structure. In one embodiment, the recess is formed by selectively etching a portion of an intermediate insulating layer in the multi-layered structure. A semiconductor layer is then deposited over the multi-layered insulating structure, and fills the recess. An anisotropic etching step is carried out to transform a portion of the semiconductor layer into sidewall spacers, which function as source and drain regions for the thin-film transistor.

BRIEF DESCRIPTION OF THE DRAWINGS

FIG. 3-1 illustrates, in cross-section, a portion of the thin-film transistor shown in FIG. 1, taken along section line 3—3 according to a first embodiment;

FIG. 3-2 illustrates, in cross-section, a portion of the thin-film transistor shown in FIG. 1, taken along section line 3—3 according to a second embodiment;

FIG. 9-1 illustrates, in cross-section, a shared contact of the device structure illustrated in FIG. 6 and taken along section line 9—9;

FIG. 9-2 illustrates, in cross-section, another embodiment of the shared contact shown in FIG. 9-1;

Figure 1:
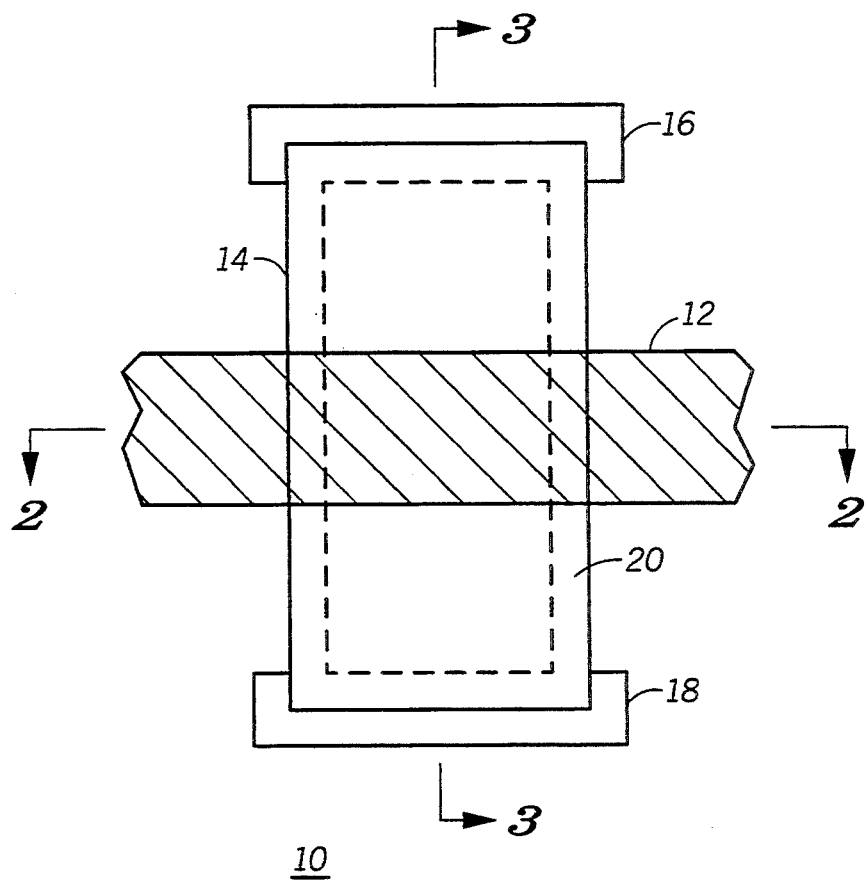
FIG. 1 illustrates, in plan view, an exemplary embodiment of a thin-film transistor in accordance with the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides a thin-film transistor having a channel region which is inlaid in a multi-layer insulating structure. The channel region of the thin-film transistor is defined within a recess formed at the perimeter of the multi-layered insulating structure. As will subsequently become apparent, a thin-film transistor having an inlaid channel region can be electrically coupled to other transistors to construct a highly compact semiconductor device. The construction of the thin-film transistor of the invention is such that when incorporated with a transistor fabricated in a semiconductor substrate, the amount of surface area consumed by the substrate transistor is not increased. The ability to couple a thin-film transistor to an existing bulk device without increasing consumption of substrate surface area enables the formation of devices having increased functional capability, while not reducing the packing density of an integrated circuit device. Additionally, the construction of a thin-film transistor having an inlaid channel region provides a thin-film transistor having improved performance characteristics. For example, a long effective channel length can be formed around the perimeter of a multi-layered insulating structure, which ensures good short-channel behavior.

Shown in FIG. 1, in plan view, is an exemplary embodiment of a thin-film transistor formed in accordance with of the invention. The thin-film transistor is constructed over a device region 10 of a semiconductor substrate. The thin-film transistor includes a thin-film gate electrode overlying a multi-layer insulating structure 14. Thin-film source and drain regions 16 and 18, respectively, extend from opposite ends of insulating structure 14. A thin-film channel region 20 is inlaid around the perimeter of insulating structure 14 and extends from source region 16 to drain region 18. The thin-film transistor illustrated in FIG. 1 is shown in an illustrative embodiment whose purpose is to clearly denote the various elements of the thin-film transistor of the present invention. It is important to note that in the various possible implementations of the thin-film transistor the elements illustrated in FIG. 1 can differ considerably from the configuration illustrated.

Figure 2:
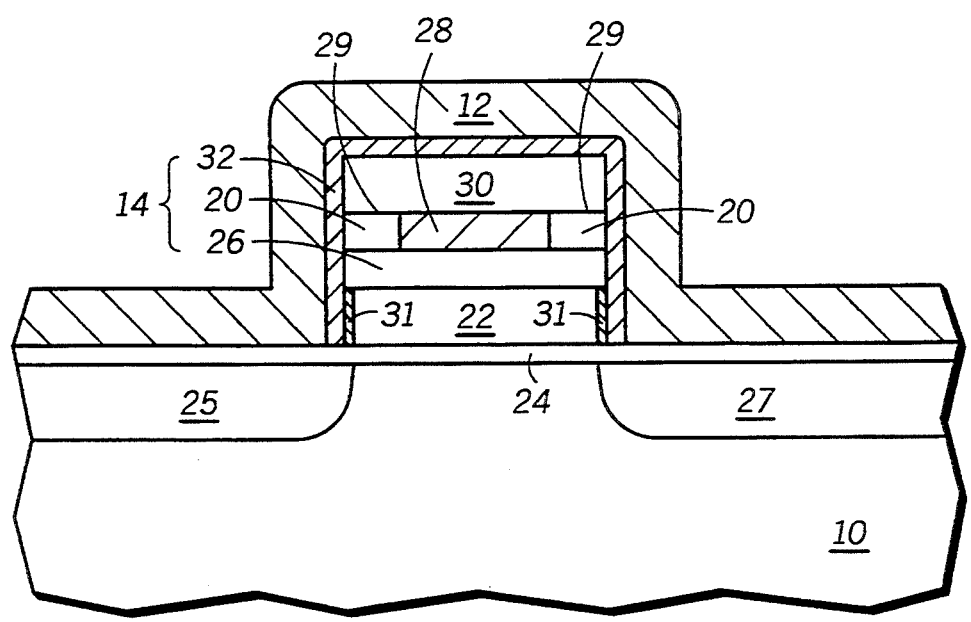
FIG. 2 illustrates, in cross-section, a portion of the thin-film transistor shown in FIG. 1, taken along section line 2—2.

FIG. 2 illustrates a portion of the thin-film transistor shown in FIG. 1 taken along section line 2—2. In the embodiment of the invention illustrated in FIG. 2, insulating structure 14 includes a driver gate electrode 22. Driver gate electrode 22 is separated from active region 10 by a gate dielectric layer 24. Thin-film gate electrode 12 overlies insulating structure 14 and portions of gate dielectric layer 24. Thin-film channel region 20 lies intermediate to a first insulating layer 26 and a second insulating layer 30. A channel spacing layer 28 also lies intermediate to first and second insulating layers 26 and 30 and forms the inner wall of a recess 29 containing thin-film channel region 20. A thin-film dielectric layer 32 separates thin-film gate electrode 12 from thin-film channel region 20. Source and drain regions 25 and 27 reside in active region 10 on either side of driver gate electrode 22. Source and drain regions 25 and 27, and gate electrode 22 comprise the functional elements of a driver transistor 33 formed in active region 10. Although the illustrative embodiment shown in FIG. 2 depicts the thin-film transistor of the invention in association with a driver transistor, it is to be noted that the thin-film transistor of the invention can be independent of the driver transistor shown in FIG. 2.

Figures 1, 3:
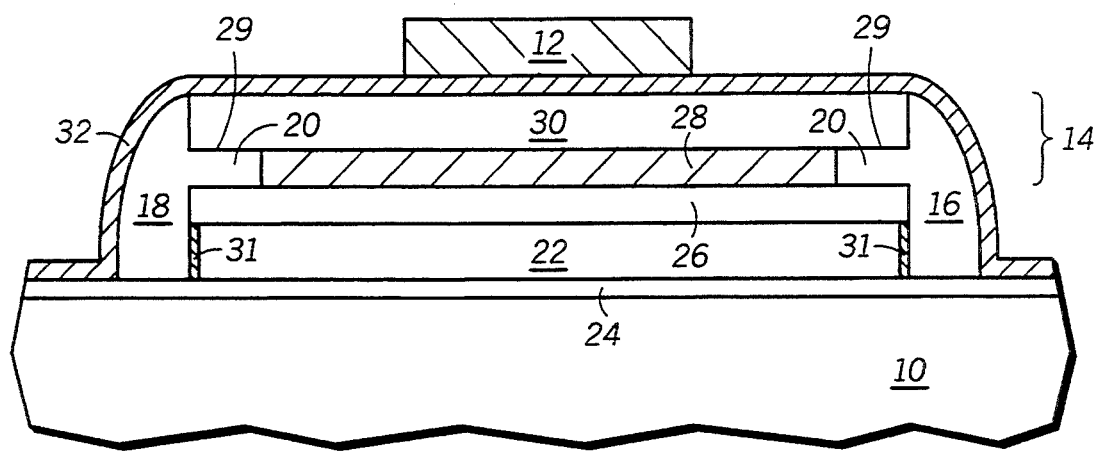
Figures 2, 3:
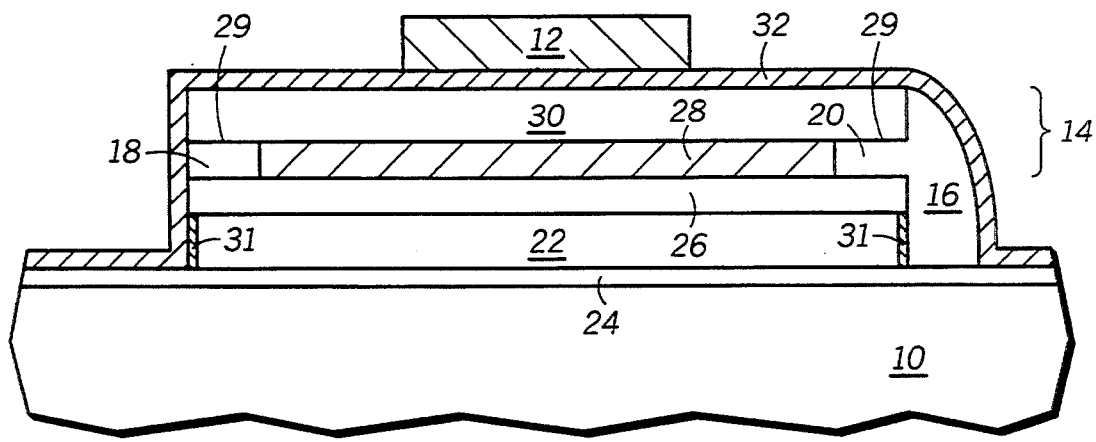

FIG. 3-1 illustrates a portion of the thin-film transistor shown in FIG. 1 taken along section line 3—3, according to a first embodiment. In FIG. 3-1, thin-film source and drain regions 16 and 18 are more clearly shown as integral portions of thin-film channel region 20. In a preferred embodiment, thin-film source and drain regions 16 and 18 are formed as sidewall spacers overlying an edge portion of insulating structure 14. In the particular embodiment illustrated in FIG. 3-1, thin-film sidewall spacers 16 and 18 also overlie an edge portion of driver gate electrode 22. The ability to form thin-film source and drain regions as sidewall spacers represents an important advantage of the present invention. The placement of source and drain regions in a narrowly defined region adjacent to the insulating structure further reduces the amount of surface area necessary to form a thin-film transistor. The thin-film source and drain regions are formed as sidewall spacers adjacent to the insulating structure and function with the inlaid channel region to provide a highly compact thin-film transistor configuration.

In a second embodiment, illustrated in FIG. 3-2, drain region 18 is formed to reside within recess 29 such that no portion of the drain region extends from multi-layered insulating structure 14. The embedded drain structure can be formed, for example, by masking source region 16, then continuing the etching process to remove the remaining semiconductor material at the drain end of multi-layered insulating structure 14. Subsequently, the semiconductor material within recess 29, at the drain end, can be autodoped from the layer of semiconductor material used to form thin-film gate electrode 12. By forming the thin-film drain region within recess 29, the size of the thin-film transistor can be further reduced.

The fabrication of the thin-film transistor illustrated in FIGS. 1-3 can be carried out, for example, by initially oxidizing the surface of active region 10 to form gate dielectric layer 24. Subsequently, a semiconductor layer is deposited to overlie gate dielectric layer 24, and three successive layers of insulating material are deposited to overlie the semiconductor layer. A sequential etch process is then performed to etch the insulating layers and the semiconductor layer to form insulating structure 14 and underlying driver gate electrode 22. Following the sequential etching process to define the overall dimensions of insulating structure 14, a reoxidation step is carried out to form a sidewall oxide layer 31 on the portions of gate electrode 22 exposed by the sequential etching process.

After gate electrode 22 is protected, an isotropic etching process is carried out to selectively etch spacing layer 28. The selective isotropic etching process removes portions of spacing layer 28 while not substantially etching first and second insulating layers 26 and 30. The isotropic etching process results in the formation of recess 29. In a preferred embodiment, spacing layer 28 is constructed from a material which is selectively etchable with respect to the insulating material of first and second insulating layers 26 and 30.

In a preferred embodiment, driver gate electrode 22 is polycrystalline silicon, and first and second insulating layers are silicon dioxide formed by chemical vapor deposition using tetraethylorthosilane (TEOS) source gas. The required selective etching characteristics can then be readily obtained by the fabrication of spacing layer 28 from a material which is selectively etchable to silicon dioxide. Preferably, spacing layer 28 is formed by chemical vapor deposition of a layer of silicon nitride. Spacing layer 28 can be isotropically etched using a wet etching solution, such as phosphoric acid, or alternatively, using a selective dry-etching process including a fluorinated etching gas. Those skilled in the art will appreciate that the formation of recess 29 only requires that spacing layer 28 be selectively etchable to first and second insulating layers 26 and 30. Therefore other combinations of insulating material can be used and are within the scope of the present invention. For example, first and second insulating layers 26 and 30 can be silicon nitride and spacing layer 28 can be silicon dioxide.

After forming recess 29, a semiconductor layer is formed by chemical vapor deposition to overlie gate dielectric layer 24 and insulating structure 14. During the chemical vapor deposition process, semiconductor material is deposited on all exposed surfaces including the inner surfaces of recess 29. The deposition process continues by forming successive layers of semiconductor material eventually filling recess 29. Following the deposition process, excess semiconductor material is then etched away leaving a portion of the deposited material within recess 29. The etching process thus defines thin-film channel region 20 within recess 29 along the perimeter of insulating structure 14. In a preferred embodiment, the semiconductor layer is doped by ion implantation prior to performing the etching process. The ion implantation energy is adjusted such that dopant ions do not penetrate into recess 29, thereby leaving thin-film channel region 20 undoped. The anisotropic etching process is then carried out to form thin-film source and drain regions 16 and 18. It is important to note that the ion implant and anisotropic etching process form self-aligned source, drain, and channel regions, having the proper doping characteristics without the use of a photolithography step.

In an alternative processing method, an amorphizing implant can be performed either before or after introducing the conductivity determining dopant. In the instance of a polycrystalline silicon thin-film, an element such as chlorine, fluorine, germanium, or silicon can be implanted to change the film structure to an amorphous state. Following the implant, the film is annealed to reform crystalline grains. The reformed grains are substantially larger than the original grains providing fewer grain boundaries in the polycrystalline film. By reducing the number of grain boundaries, electron trapping at the grain boundaries is reduced which improves electrical conductance of the source and drain regions in the thin-film transistor. It is important to note that, the amorphizing species does not penetrate into the recess leaving the thin-film channel region unaffected.

Figure 13:
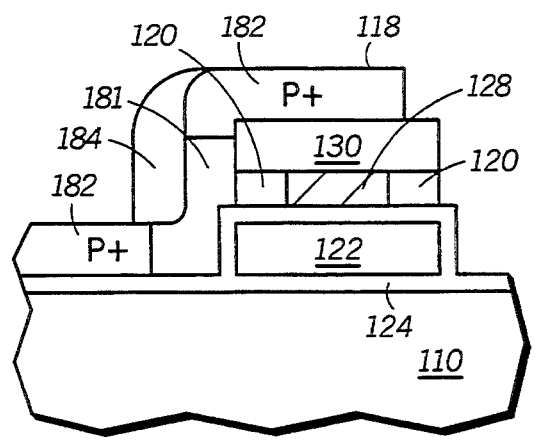
FIG. 13 illustrates, in cross-section, a portion of a thin-film transistor in accordance with the invention, having a lightly doped drain structure.

The thin-film transistor of the invention can be formed fully self-aligned to the multi-layered insulating structure solely by ion implantation and etching. However, enhanced performance of a thin-film transistor can be attained by forming an off-set drain structure. To form an off-set drain, a photolithographic pattern is formed to expose a portion of the thin-film drain region at a predetermined distance from the thin-film channel region. Then an ion implant process is carried out to dope only the exposed portion. One example of such a drain structure is illustrated in FIG. 13. Additionally, a lightly-doped drain structure can be formed using the process description accompanying FIG. 13. Of course, in cases where a particular geometric configuration is desired, a photolithography and etching process can be used to form thin-film source and drain regions 16 and 18.

Source and drain regions 25 and 27 associated with the driver transistor 33 can be formed either before or during the process of forming thin-film channel region 20. Using a conventional process, source and drain regions 25 and 27 can be formed by self-aligned ion implant process using insulating structure 14 as an implant mask. Those skilled in the art will recognize that lightly doped regions can also be formed using a conventional sidewall spacer process. In the present invention, the formation of recess 29 and the formation of a lightly-doped drain structure can be coupled. In one embodiment, silicon nitride is used to form both spacing layer 28 and the sidewall spacers. Both the sidewall spacers and a portion of spacing layer 28 are simultaneously removed by isotropically etching the silicon nitride using, for example, phosphoric acid. Thus, the processes of forming recess 29 and a lightly-doped drain region can be performed at the same time.

In another method, lightly doped source and drain regions can also be formed in the substrate by advantageously using the semiconductor material deposited to form thin-film channel region 20. In this case, the etching process which removes the deposited semiconductor material is stopped at a point where sidewall spacers overlie the edge of driver gate electrode 22. At that point, source and drain regions 25 and 27 are heavily implanted using the semiconductor material as an implant mask. The semiconductor material is then subsequently removed by continuing the etching process until only that portion of the semiconductor material residing in recess 29 remains.

Preferably, thin-film channel region 20 is formed by chemical vapor deposition of 500–1200 angstroms of undoped polycrystalline silicon. In a preferred embodiment, thin-film source and drain regions 16 and 18 are simultaneously formed during the polycrystalline silicon deposition process. Once the polycrystalline silicon has been deposited a reactive ion etch is used to form source and drain regions 16 and 18 as sidewall spacers overlying the edge of insulating structure 14. Next, a photolithographic pattern is defined to protect regions where the source and drain regions are to reside, and an anisotropic etch is performed to remove remaining portions of polycrystalline silicon overlying the edge of insulating structure 14 which is exposed by the photolithographic mask. Thus, both the source and drain regions and the channel region of the thin-film transistor are formed by a self-align process, which aligns the source and drain region and the channel region to insulating structure 14. Moreover, the thin-film channel and source and drain regions are formed by the deposition and etching of a single polycrystalline silicon layer. In the single deposition process, thin-film source and drain regions are formed having a substantially greater thickness than the thin-film channel region. This is because the thickness of the thin-film channel region is determined by the dimensions of recess 29 and not by the thickness of the deposited polycrystalline layer. The thickness differential is advantageous for the performance of the thin-film transistor. The relatively thicker source and drain regions have a lower sheet resistance than the channel region. The low resistance source and drain regions improve on-current of the thin-film transistor.

The process continues by forming a thin-film gate dielectric layer 32 overlying thin-film channel region 20. Thin-film gate dielectric layer 32 can be formed by either a chemical vapor deposition process or by thermally oxidizing the exposed portions of thin-film channel region 20. In the embodiment illustrated in FIG. 2, a chemical vapor deposition process has been used to form a silicon dioxide layer overlying the surface of insulating structure 14 and driver gate electrode 22. Alternatively, thin-film gate dielectric 32 can be silicon nitride, oxynitride, a multi-layered dielectric composite of silicon nitride and silicon oxide, boron oxynitride, and the like.

Preferably, thin-film gate electrode 12 is formed by depositing a semiconductor layer, such as polycrystalline silicon, over thin-film gate dielectric layer 32. Thin-film gate electrode 12 can be defined in a variety of configurations. The particular configuration will depend upon the intended application of the thin-film transistor in an integrated circuit. As illustrated in FIG. 1, thin-film gate electrode 12 is configured as a relatively narrow strip of semiconductor material overlying a central portion of insulating structure 14. As will subsequently be described, the configuration of thin-film gate electrode 12 can vary substantially depending upon the particular method of electrically coupling the thin-film transistor to other integrated circuit components. Thin-film gate electrode 12 provides electrical control to the portion of thin-film channel layer 20 lying directly opposite the gate electrode and separated therefrom by gate dielectric layer 32. Those skilled in the art will recognize that the thin-film transistor of the present invention provides a thin-film transistor in which the depth of the channel is defined by the lateral dimensions of recess 29, and the width of the channel is defined by the vertical dimensions of recess 29.

The forgoing process offers several advantages in the fabrication of a device structure which includes a substrate transistor and thin-film transistor. The placement of the thin-film channel region in a recess, permits a blanket layer to be deposited and a blanket doping process to be performed without damaging the underlying substrate transistor. After forming the thin-film channel region, the blanket deposited of silicon can be doped by, for example, ion implantation. The implanted dopant will not enter the underlying substrate, where source and drain regions of the substrate transistor reside. The blanket layer can subsequently be patterned and etched to configure the source and drain region as desired. In contrast, in a conventional thin-film transistor process the thin-film channel region is exposed, therefore, an additional photolithography step must be used to protect the thin-film channel from subsequent doping steps.

Figure 4:
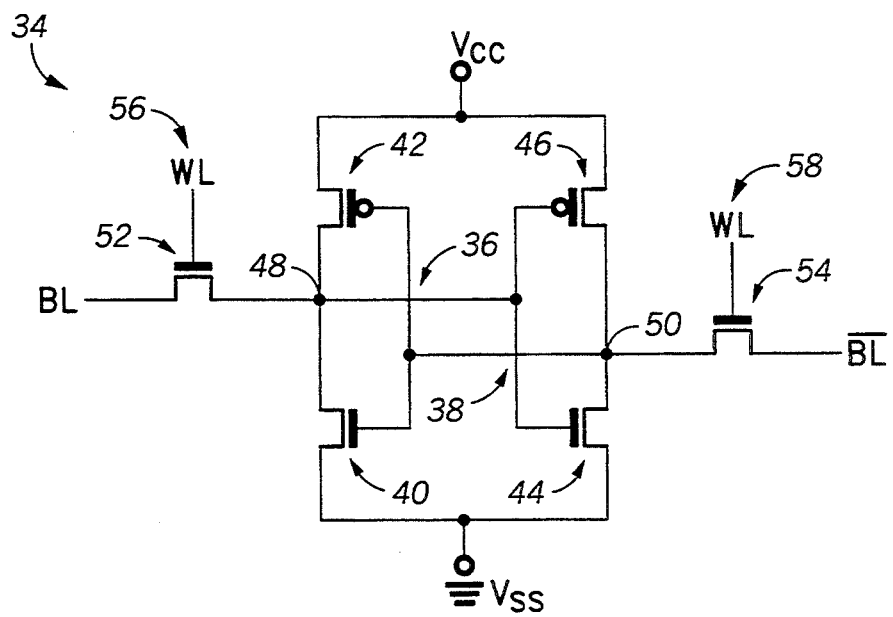
FIG. 4 is a schematic circuit diagram of an SRAM memory device having cross-coupled CMOS inverters.

The following description relates to one embodiment of the invention in which the thin-film transistor comprises a portion of an SRAM memory cell. Shown in FIG. 4 is a schematic circuit diagram of an SRAM memory cell 34. Those skilled in the art will recognize the schematic circuit diagram as that of a conventional SRAM memory cell having active load devices. Memory cell 34 includes two cross-coupled CMOS inverters 36 and 38. CMOS inverter 36 includes an NMOS driver transistor 40 an a PMOS thin-film load transistor 42. Similarly, CMOS inverter 38 includes an NMOS driver transistor 44 and a PMOS thin-film load transistor 46. The input of CMOS inverter 36 is coupled to the output of inverter 38 by a shared contact formed at node 50, and the input of CMOS inverter 38 is coupled to the output of inverter 36 by a shared contact formed at node 48. Two pass transistors 52 and 54 are controlled by wordlines 56 and 58, respectively. Pass transistors 52 and 54 are also coupled to the outputs of inverters 36 and 38 at nodes 48 and 50 respectively. Pass transistors 52 and 54 provide bit-line access to memory cell 34. As further illustrated in FIG. 4, a Vcc power supply signal is provided to the source regions of thin-film load transistors 42 and 46. A Vss ground signal is provided to the source regions of driver transistors 40 and 44.

Figure 5:
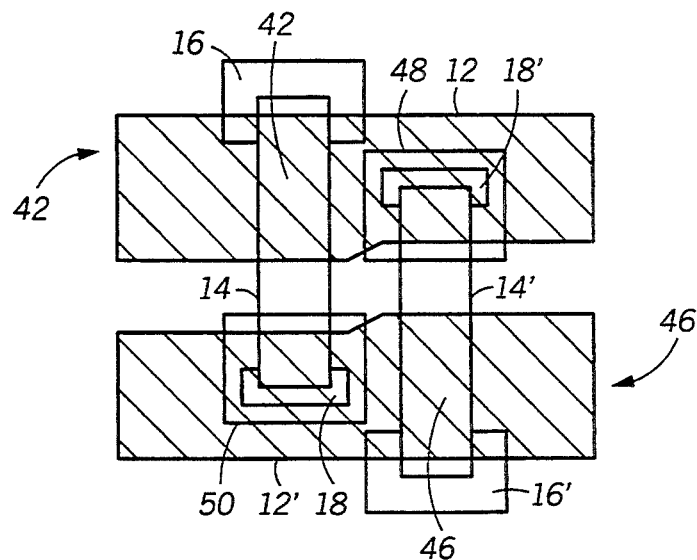
FIG. 5 illustrates, in plan view, two cross-coupled thin-film transistors constructed it accordance with the invention.

FIGS. 5–9 illustrate the implementation of the thin-film transistor of the present invention as a load transistor of the SRAM memory cell schematically illustrated in FIG. 4. FIG. 5 illustrates, in plan view, thin-film load transistors 42 and 46 of the invention configured for implementation into memory cell 34. Insulating structures 14 and 14' are placed in substantially parallel alignment, and are disposed in close proximity to each other. Thin-film transistors 42 and 46 are interconnected by shared contacts 48 and 50. Thin-film gate electrodes 12 and 12' overlie portions of insulating structures 14 and 14', respectively, and extend through shared contacts 48 and 50. The portion of thin-film gate electrodes 12 and 12' extending through shared contacts 48 and 50 electrically couples the drain region of each thin-film transistor to the substrate. It is important to note that the inventive formation of thin-film source and drain regions 16 and 18, and 16' and 18', together with inlaid thin-film channel regions, enable thin-film transistors 42 and 46 to be placed in close proximity to one another. The inventive arrangement of thin-film load transistors 42 and 46 allows the ready integration of the transistors into a memory cell, such as memory cell 34, without enlarging the amount of substrate surface area needed to fabricate the memory cell.

Figure 6:
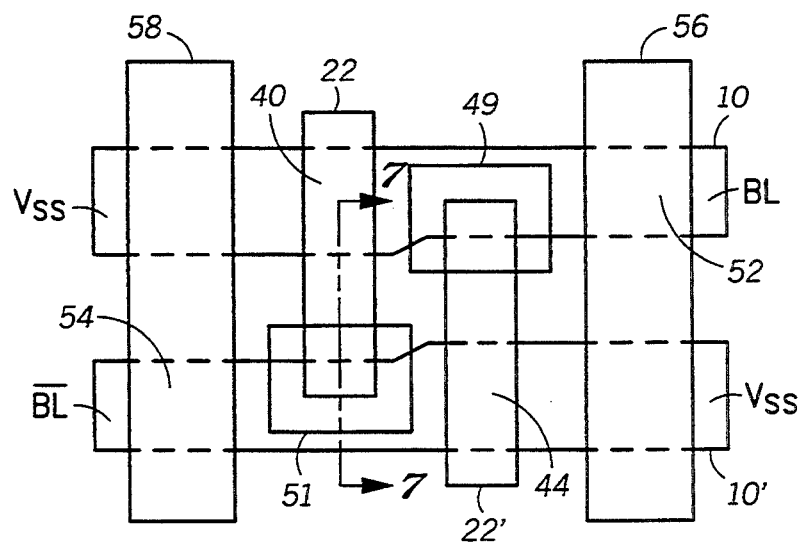
FIG. 6 illustrates, in plan view, driver transistors and wordlines arranged in a suitable configuration for electrical interconnection with the thin-film transistors shown in FIG. 5.

Shown in FIG. 6, in plan view, are portions of memory cell 34 which directly overlie the substrate. Driver transistors 40 and 44 are aligned substantially parallel to one another, and are disposed in close proximity to each other. Driver gate electrodes 22 and 22' are electrically coupled to active regions 10' and 10, respectively. Wordlines 56 and 58 overlie opposite end portions of active regions 10 and 10'. Bit line signals are introduced to active regions 10 and 10' at a portion of the active regions which extends beyond the wordlines. The point at which the wordlines cross over the active regions near the bitline contacts defines pass transistors 52 and 54. Vss signals are introduced at alternate opposite ends of active regions 10 and 10'. The Vss signals are routed through the substrate below the point at which wordlines 56 and 58 cross over the active regions. The current pass in the active regions carrying the Vss signal are electrically coupled to the source regions of driver transistors 40 and 44. Two buried contracts 49 and 51 are also illustrated in FIG. 6. Buried contacts 49 and 51 electrically couple the driver gate electrodes 40 and 44 directly to the substrate. When overlaid by shared contracts 48 and 50, thin-film gate electrodes 42 and 46 will also electrically couple portions of driver gate electrodes 40 and 44 to the thin-film gate electrodes.

Figure 7:
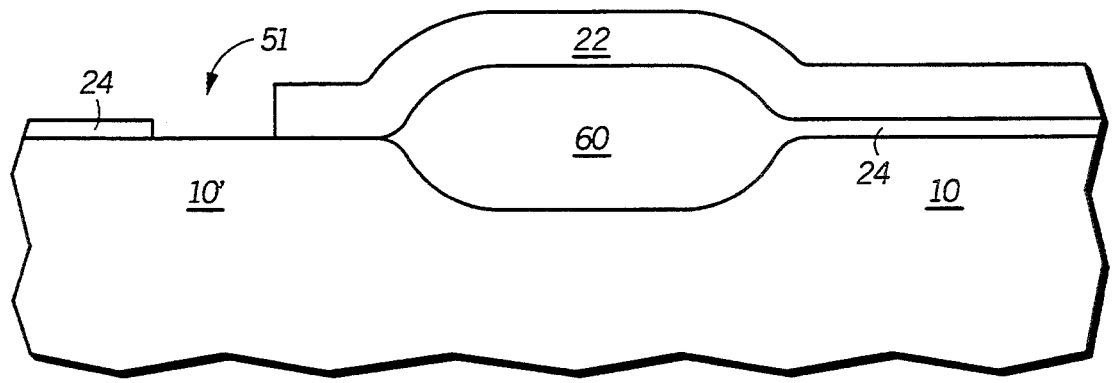
FIG. 7 illustrates, in cross-section, a portion of a driver transistor shown in FIG. 6, taken along section line 7—7.

FIG. 7 illustrates a cross-section of buried contact 51, taken along section line 7—7 of FIG. 6. Driver gate electrode 22 extends from active region 10 across a field oxide region 60 to active region 10' at which point driver gate electrode 22 forms a metallurgical contact to active region 10'. To form the contact, a portion of gate dielectric layer 24 is removed to expose a portion of active region 10'. Those skilled in the art will recognize this structure as a buried contact commonly used in the formation of a variety of MOS devices. Using buried contact 51, driver gate electrodes 22 and 22' are cross-coupled to active regions 10 and 10'.

Figure 8:
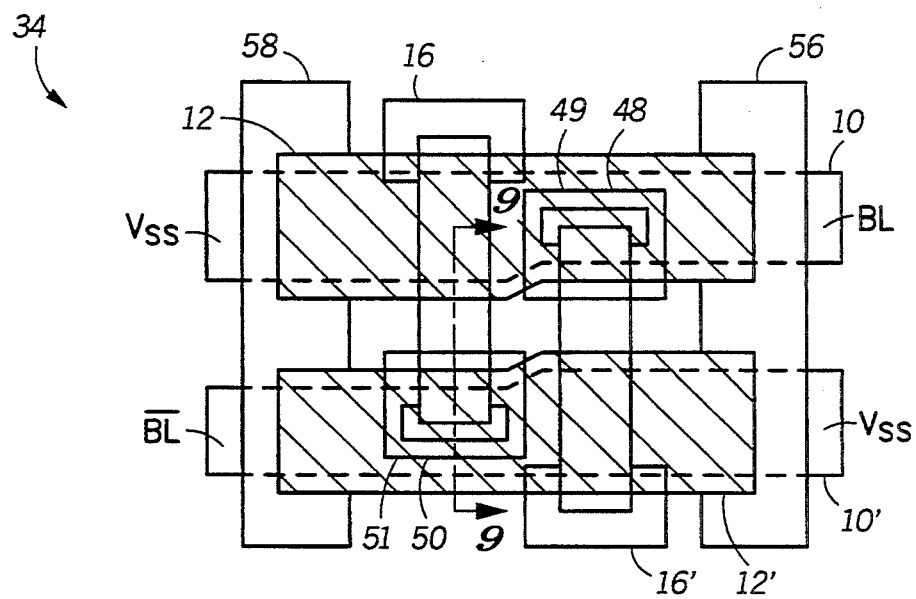
FIG. 8 illustrates, in plan view, an integrated composite layout employing the transistor structures illustrated in FIGS. 5 and 6, and configured in accordance with the invention.

FIG. 8 illustrates, in plan view, memory cell 34 upon the inclusion of both thin-film load transistors and driver transistors. As depicted in FIG. 8, portions of thin-film source regions 16 and 16' protrude beyond the edges of active regions 10 and 10' and thin-film gate electrodes 12 and 12'. The protruding portions of the thin-film source regions provide contact sites for electrically coupling a Vcc signal to memory cell 34. It is important to note that the inlaid channel regions of thin-film transistors 42 and 46 align exactly with driver gate electrodes 22 and 22'. This exact alignment enables the placement of the thin-film transistors over the driver transistors in the same geometrical configuration. Additionally, as pointed out earlier, the construction of thin-film source and drain regions as sidewall spacers on the insulating structures allows the thin-film transistors to be brought in close proximity to each other.

As illustrated in FIG. 8, the inventive features of the thin-film transistor of the present invention achieve a high-density SRAM cell with minimal transistor spacing. In addition to achieving high performance as a result of increased switching speeds and reduced signal impedance, the inlaid thin-film channel regions provide good cell stability. Those skilled in the art will appreciate that the high-density arrangement of the thin-film transistors can be achieved by using the fabrication process described in the exemplary embodiment. By using a sidewall spacer process to form thin-film source and drain regions 16 and 18 on the multi-layered insulating structure, the separation distance of the thin-film channel regions is only limited by the thickness of the sidewall spacers. Using state-of-the-art chemical vapor deposition processes, very thin layers of semiconductor material can be deposited and anisotropically etched to form the thin-film source and drain regions. Ultimately, the separation distance of the thin-film transistors can be brought into direct proportion with the deposition thickness capability of a thin-film deposition process. It is also important to recognize that the particular geometric representation of the components of memory cell 34 can vary from that shown in FIGS. 5, 6 and 8. For example, multi-layered insulating structures 14 and 14' can have protuberances, or be "L" shaped, or "T" shaped, or the like. SRAM memory cells having thin-film load transistors configured differently from those illustrated herein are disclosed in commonly assigned patent application Ser. No. 07/909,512, filed Jun. 6, 1992, and issued Mar. 1, 1994 as U.S. Pat. No. 5,291,053 and such disclosure is hereby incorporated by reference.

Figures 1, 9:
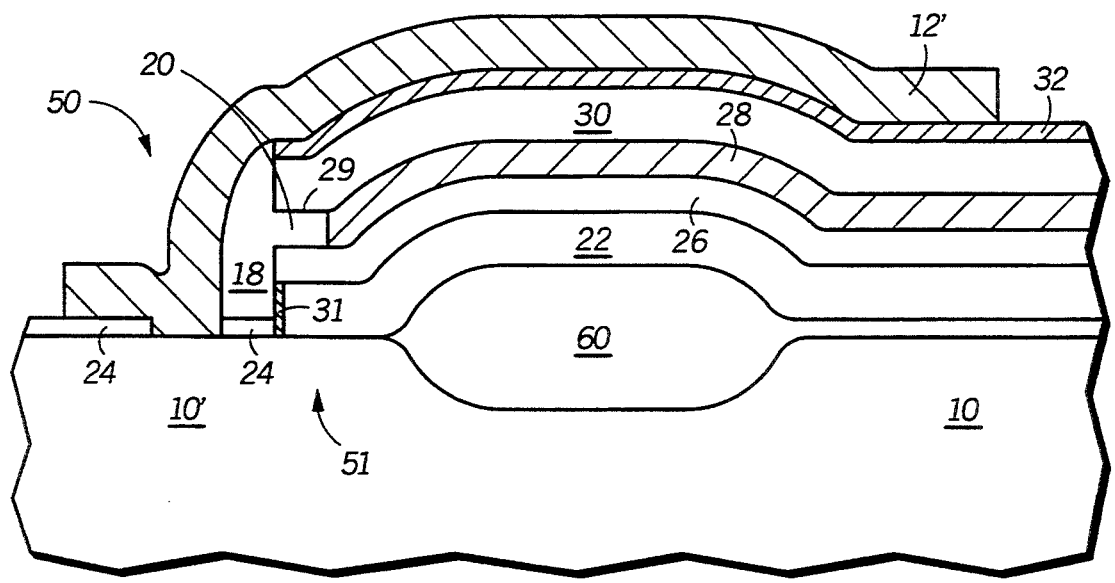
Figures 2, 9:
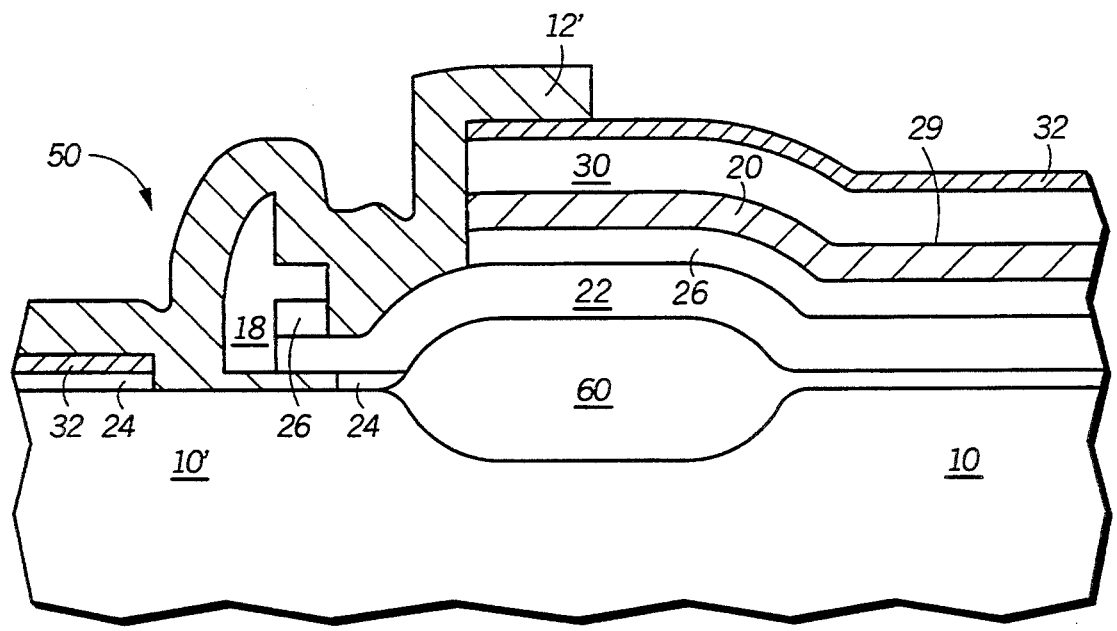

FIG. 9-1 illustrates a cross-section through shared contact 50 taken along section line 9—9 of FIG. 8. Thin-film gate electrode 12 overlies thin-film drain region 18 and forms a metallurgical contact to active region 10'. Thin-film drain region 18 and driver gate electrode 22 also form a metallurgical contact to active region 10' in buried contact 51. Shared contact 50 provides a site for electrically coupling the gate electrodes of transistors 40 and 42 to the common drain regions of thin-film transistors 44 and 46.

FIG. 9-2 illustrates, in cross-section, another embodiment of shared contact 50. In the embodiment shown, a buried contact is not formed prior to forming shared contact 50. Prior to forming thin-film gate electrode 12, a portion of the insulating layers overlying driver gate electrode 22 are anisotropically removed to expose a central portion of driver gate electrode 22, while leaving the thin-film channel layer around the periphery of multi-layered insulating structure 14 in tact. Then, gate dielectric layer 24 is isotropically etched to remove a portion overlying active region 10', including a portion underlying thin-film drain region 18 and driver gate electrode 22. A layer of semiconductor material 12' is chemical vapor deposited to overlie the exposed portion of driver gate electrode 22, and to fill the space beneath thin-film drain region 18 and the edge of the driver gate electrode. The embodiment illustrated in FIG. 9-2 has the advantage of avoiding the necessity of a buried contact to connect the driver gate to the substrate, thus simplifying the process.

While the shared and buried contact structures described herein provide solid metallurgical connection for electrically coupling the various device components, they involve bringing together semiconductor materials of opposite conductivity type. Whenever opposite conductivity materials are brought together at a metallurgical junction the junction will possess diode characteristics. In some cases, diode formation can degrade the performance of the device by inhibiting the flow of electrical current in one direction. To avoid the problem of diode formation it is possible to use a metal strap to interconnect semiconductor materials of different conductivity type. Those skilled in the art will recognize that a metallized contract structure can be used to form shared contacts 48 and 50. A metallized contact structure is disclosed in commonly assigned U.S. Pat. No. 4,966,864, issued Oct. 30, 1989, and such disclosure is hereby incorporated by reference.

Figure 10:
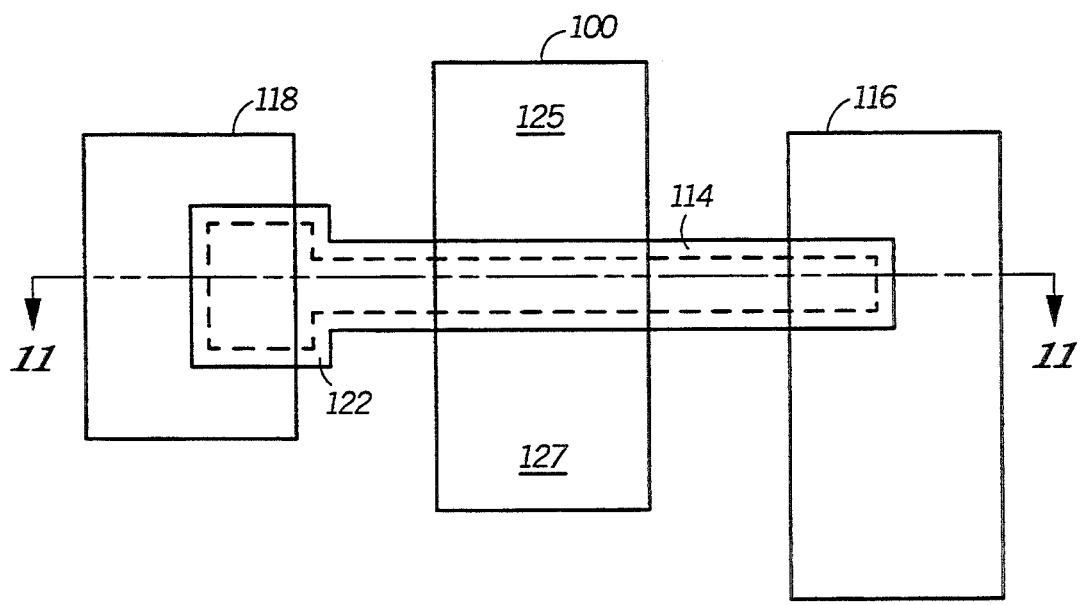
FIG. 10 illustrates, in plan view, another embodiment of the thin-film transistor arranged in accordance with the invention and including a shared-gate electrode.
Figure 11:
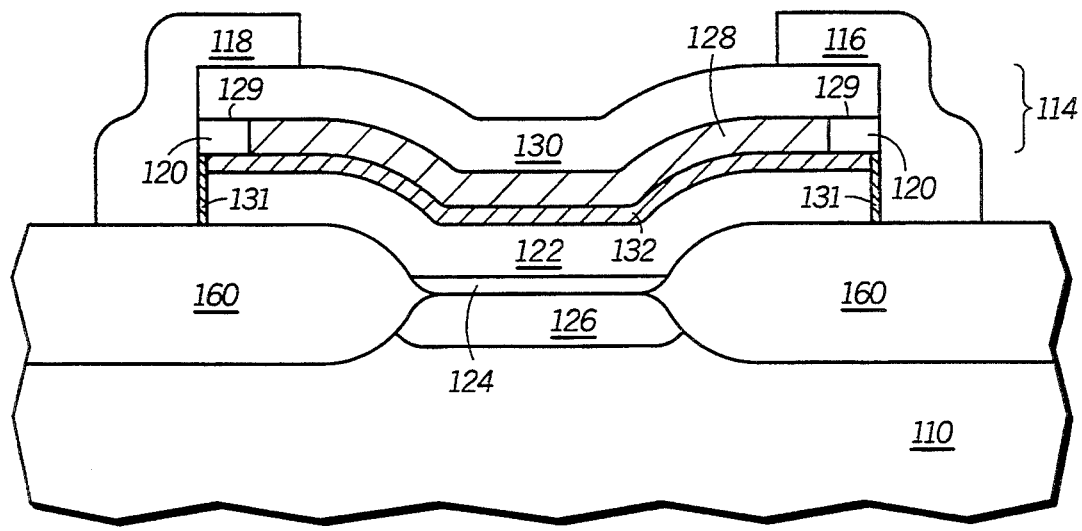
FIG. 11 illustrates, in cross-section, a portion of the shared-gate structure of the FIG. 10, taken along section line 11—11.

Shown in FIGS. 10 and 11 is another embodiment of the invention in which a shared-gate electrode electrical controls both a thin-film channel region, and a channel region located in an underlying substrate. Shared-gate electrode 122 lies beneath an inlaid thin-film channel region 120, and also overlies a channel region 126 in substrate 110. A channel spacing layer 128 overlies shared-gate electrode 122 and separates shared-gate electrode 122 from an overlying insulating layer 130. A thin-film gate dielectric layer 132 separates shared-gate electrode 122 from thin-film channel region 120. Thin-film source and drain regions 116 and 118 metallurgically contact thin-film channel region 120, and overlie edge portions of isolation layer 130. Gate electrode 122 crosses over an active region 100 in the substrate and is separated therefrom by gate dielectric layer 124. Source and drain regions 125 and 127 associated with a substrate transistor reside in active region 100. A channel region 126 underlies shared-gate electrode 122 and is electrically controlled by shared-gate electrode 122.

FIG. 11 illustrates, in cross-section, the transistor structure of FIG. 10 taken along the section line 11—11. Field oxide layers 160 electrically isolate active region 100 from other active regions (not shown) in remaining portions of substrate 110. The shared-gate transistor structure illustrated in FIGS. 10 and 11 advantageously combines a bulk transistor and a thin-film transistor wherein the gate electrode is shared by the two transistors. The shared-gate transistor structure of the present embodiment can be electrically coupled to other device components in an integrated circuit to perform various logic functions. For example, the shared-gate structure of the present embodiment can be used as an individual inverter, or can be coupled with a second inverter to form a memory cell as illustrated in FIG. 4.

The fabrication of the shared-gate inverter is carried out in substantially the same manner as described in the previous embodiment. As illustrated in FIG. 11, thin-film source and drain regions 116 and 118 are blocks of semiconductor material formed by a photolithographic and reactive ion etching process. Following a blanket deposition of a semiconductor material, such as polysilicon, and the like, a photolithographic mask is applied to define the thin-film source and drain regions, and exposed portions of the semiconductor material are removed. The etching process leaves blocks of semiconductor material at selected locations. The thin-film source and drain regions are configured in a predetermined pattern depending upon the particular application in which the shared-gate transistor is to be employed. Although illustrated as a block of semiconductor material, source and drain regions 116 and 118 can be formed by the sidewall spacer process described in the previous embodiment.

As in the previous embodiment, thin-film channel region 120 resides in a recess 129 formed by isotropically etching spacing layer 128. In the embodiment illustrated in FIGS. 10 and 11, the depth of thin-film channel region 120 is determined by the thickness of spacing layer 128. Additionally, the lateral dimensions of recess 129 determine the channel width of the thin-film transistor. The channel length is determined by the distance between thin-film source and drain regions 116 and 118. Thus the channel width-to-length (W/L) ratio of the thin-film transistor is determined by the dimensions of shared-gate electrode 122 and the lateral dimension of recess 129. Those skilled in the art will appreciated that the self-aligned construction of the thin-film transistor provides a highly compact inverter structure requiring minimal substrate surface area, and that such a structure can be advantageously used in a high density integrated circuit device.

Figure 12:
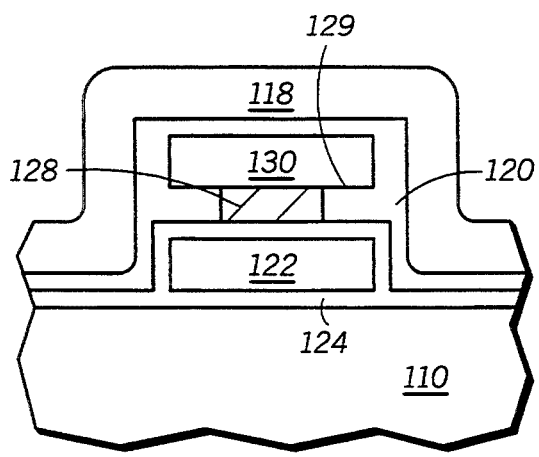
FIG. 12 illustrates, in cross-section, a portion of a thin-film transistor formed in the accordance with the invention, and including an undoped thin-film channel region.
Figure 14:
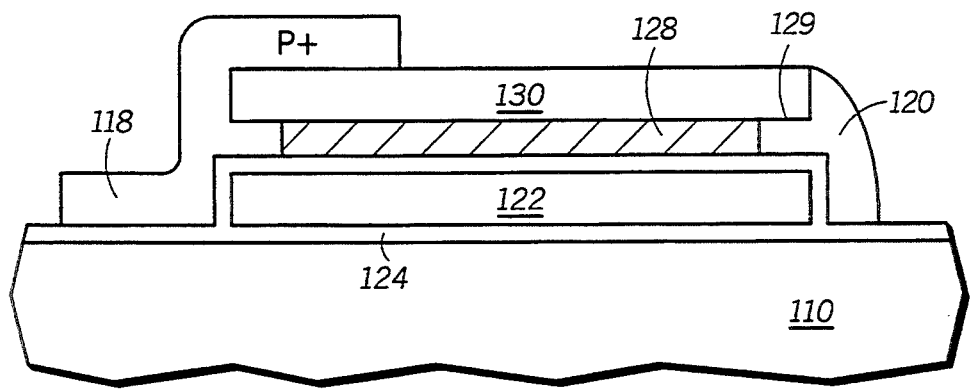
FIG. 14 illustrates, in cross-section, a portion of a thin-film transistor in accordance with the invention, having an expanded thin-film channel region.

FIGS. 12-14 illustrate various constructions of the thin-film source and drain regions of the present invention. FIG. 12 illustrates a method for providing an undoped polycrystalline silicon material in recess 129, which is then metallurgically contacted to highly-doped, thin-film drain region 118. To form an undoped thin-film channel region 120, a layer of undoped polycrystalline silicon is first deposited by chemical vapor deposition to overlie shared-gate 122 and insulating layer 130. Following the deposition of an undoped polycrystalline silicon layer, a second chemical vapor deposition process is carried out in which a layer of polycrystalline silicon is deposited and simultaneously doped with a conductivity determining dopant. Following a reactive ion etching process a thin-film transistor (not shown) is defined having an undoped channel region in metallurgical contact with in-situ doped source and drain region. Construction of the thin-film transistor having an undoped channel region functions to reduce the off-current at the drain region of the thin-film transistor.

Alternatively, using the method illustrated in FIG. 12, channel region 120 and drain region 118 can be formed by the deposition a different material for each region. In a preferred method, a layer of polycrystalline silicon can be deposited, followed by the deposition of a layer of silicon germanium to form a polycrystalline silicon channel region, and silicon germanium source and drain regions. During the silicon deposition process, after depositing a layer of silicon sufficient to fill recess 129, germane gas is introduced into the deposition apparatus, and the deposition process is continued with the deposition of silicon germanium. Alternatively, the process can be reversed to provide a thin-film transistor having a channel region of silicon germanium and polycrystalline source and drain regions.

FIG. 13 illustrates an embodiment of the invention in which the thin-film transistor includes lightly-doped and heavily-doped regions within a thin-film drain region 118. The thin-film drain region 118 includes a lightly-doped region 181 adjacent to thin-film channel region 120. Heavily doped regions 182 reside on either side of portion 181.

The doping variation within thin-film drain region 118 can be achieved by several different methods. In one method, heavily-doped regions 182 are formed by ion implantation using a sidewall spacer 184 as a doping mask. After defining thin-film drain region 118, „sidewall spacer 184 is formed on thin-film drain region 118. Sidewall spacer 184 is a material which is differentially etchable with respect to the polycrystalline silicon material of thin-film drain region 118. Sidewall spacer 184 can be formed by the deposition of an insulating material such as silicon dioxide, silicon nitride, and the like, followed by a reactive ion etch process which leaves a portion of the dielectric material overlying vertical surfaces of thin-film drain region 118.

Those skilled in the art will appreciate that various processing sequences can be carried out to vary the doping concentration distribution in the various portions of thin-film drain region 118. For example, an ion implant can be performed prior to forming sidewall spacer 184 to form a lightly doped region, which is then more heavily doped during the ion implant process carried out following the formation of sidewall spacer 184. Additionally, sidewall spacer 184 can be formed prior to the photolithographic patterning and ion etching process used to form thin-film source drain region 118. Further, an off-set drain structure can be formed by, for example, covering most of drain region 118 with a photoresist mask and ion implanting only a portion of thin-film drain region 118 at a specified distance from thin-film channel region 120. Alternatively, the sidewall spacer can be used as a doping mask. The lightly-doped drain structure can improve the performance of the thin-film transistor by reducing the occurrence of short channel effects in the transistor, and reducing electrical resistance when the transistor is in an on-state. Moreover, an off-set drain structure improves performance of the thin-film transistor by maintaining the off-state current at a low level, which reduces leakage current from the transistor.

FIG. 14 illustrates an embodiment in which channel region 120 extends beyond the confines of recess 129 and overlies a sidewall portion of dielectric layer 130 and gate 122. The expanded channel region can be formed during the fabrication process by stopping the reactive ion etch process used to form channel region 120 within recess 129 at a point prior to the complete removal of semiconductor material. The expanded channel region effectively increases the volume of thin-film channel 120 providing a further aspect of dimensional control during the fabrication of the thin-film transistor. Following the etch process to leave a portion of thin-film channel region 120 external to recess 129, thin-film drain region 118 can be formed by the previously described chemical vapor deposition and reactive ion etching process.

Figure 15:
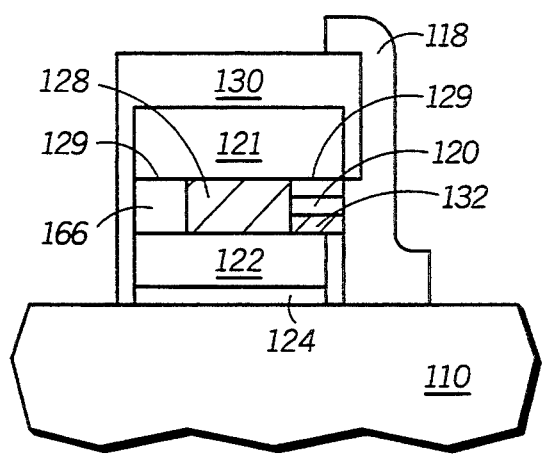
FIG. 15 illustrates, in cross-section, a thin-film transistor in accordance with the invention, having a dual gate electrode structure.

Shown in FIG. 15 is another embodiment of the invention having first and second gate electrodes 121 and 122, respectively, electrically coupled by a semiconductor region 166. Electrical control of thin-film channel region 120 is provided by first and second gate electrodes 121 and 122. Thin-film gate dielectric layer 132 separates first and second gate electrodes 121 and 122 from thin-film channel region 120. Semiconductor region 166 is formed during the chemical vapor deposition step used to form thin-film channel region 120. Prior to performing the chemical vapor deposition process, portions of thin-film dielectric layer 132 overlying a portion of recess 129 are removed. During the chemical vapor deposition process, a metallurgical junction is formed in the regions in which thin-film gate dielectric layer 32 has been removed. Other aspects of the fabrication process remain substantially as previously described. By fabricating an electrically coupled dual gate structure, an enhanced degree of electrical control can be obtained to change the current conduction capability of thin-film channel region 120.

The embodiment shown in FIG. 15, illustrates a method of fabrication of the multi-layered insulating structure in which a nitride layer is placed directly onto an underlying semiconductor layer. To fabricate the recess shown in FIG. 15, a layer of silicon nitride is deposited onto the semiconductor layer forming gate electrode 122. Next, either another insulating layer is deposited (as illustrated in the previous embodiments), or an additional semiconductor layer is deposited, and an anisotropic etch is performed. Then, a selective etch is performed to etch a portion of the silicon nitride layer. The etch selectively etches silicon nitride in preference to silicon oxide or polycrystalline silicon. Following the selective etch, an oxidation process is performed to oxidize exposed semiconductor surfaces in the recess, and a semiconductor layer is deposited to fill the recess. It is to be noted that this process can be used as an alternative fabrication process in the preceding embodiments. The structure illustrated in FIG. 15 has the advantage of providing a low profile device, which will reduce the step height of a memory cell incorporating the thin-film transistor.

Figure 16:
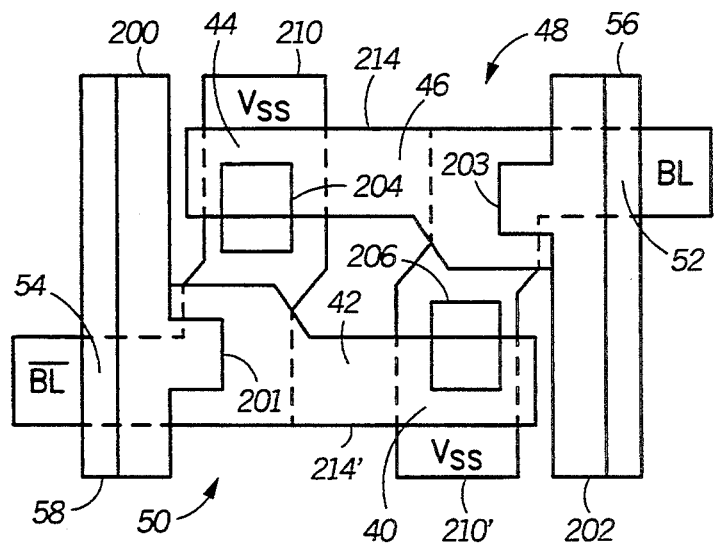
FIGS. 16 and 17 illustrate, in plane view, a memory cell layout using a shared-gate transistor structures in accordance with the invention.

Referring back to FIG. 4 it is noted that a Vcc connection is made to the source regions of thin-film transistors 42 and 46. By now it should be apparent that a wide variety of source and drain configurations can be utilized with the inlaid thin-film channel region. The ability to form self-aligned source and drain regions in the present invention can be exploited to further reduce the overall size of a memory cell by forming the source and drain regions as an integral portion of the Vcc connections. Illustrative examples of such an integral cell layout are shown in plan view in FIGS. 16 and 17. The cells shown in FIGS. 16 and 17 incorporates the shared-gate transistor structure illustrated in FIGS. 10 and 11.

Referring to FIGS. 4, 10, 11, and 16, multi-layered insulating structures 214 and 214' are disposed substantially parallel to each other. Shared-gate electrodes 122 underlie the insulating structure and are connected to active regions 210 and 210' by buried contacts (not shown) at nodes 48 and 50.

The shared-gate electrodes are coupled to the substrate in the same way as driver gate electrode 22, illustrated in FIG. 9-1. Although not shown in the plan view of FIG. 16, the buried contacts are formed in a manner similar to buried contact 51 illustrated, in cross-section, in FIG. 9-1. Driver transistors 40 and 44 reside in active regions 210' and 210, respectively, where shared-gate electrodes 122 cross over the active regions. Bitline and Vss access areas are indicated at alternating opposite ends of the active regions. Vcc layers 200 and 202 are arranged perpendicular to multi-layered insulating structures 214 and 214' and contact a first portion of the thin-film channel layers at tabs 201 and 203 to form thin-film source regions. Vcc layers 204 and 206 contact a second portion of the thin-film channel layers and form thin-film drain regions. Vcc layers 204 and 206 also contact active regions 210 and 210', respectively. The thin-film drain regions can interconnect the thin-film channel region to the active regions by any of the arrangements illustrated in FIGS. 12, 13, and 14. The connection to the active regions couples the thin-film channel regions to the substrate and completes the formation of nodes 48 and 50 shown in FIG. 4.

Fabrication of the Vcc layers is straight forward. After forming the thin-film transistor, one of more layers of insulating material is deposited to overlie the thin-film transistors, and openings are formed which expose portions of the thin-film channel layer along the edge of the multi-layered insulating structure. Once the openings are formed in an overlying passivation layer (not shown) a blanket deposition process can be used to deposit a layer of semiconductor material. The layer can then be etched to form the Vcc interconnect patter while simultaneously forming thin-film source and drain regions. Vcc layers 200 and 202 extend across an entire array of memory cells similar to that shown in FIG. 16, and are contacted by metal lines carrying a Vcc signal at a location peripheral to the array.

Figure 17:
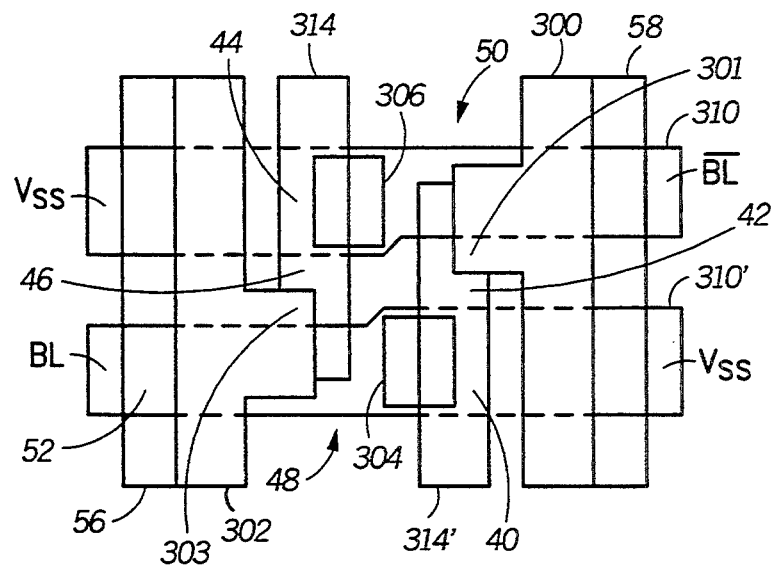

Another example of a memory cell layout using a shared-gate transistor structure is illustrated in the plan view of FIG. 17. As in the previous example, reference is made to circuit elements shown in FIG. 4, and the shared gate transistor illustrated in FIGS. 10 and 11. Multi-layered insulating structures 314 and 314' are arranged in substantially parallel relationship and are perpendicular to active regions 310 and 310'. Here again, buried contacts are formed (not shown) to connect shared-gate electrodes 122 and 122', underlying multi-layered insulating structures 314 and 314', respectively, to the active regions 310 and 310', respectively. Vcc layers 300 and 302 are parallel to multi-layered insulating structures 314 and 314' and partially overlap wordlines 56 and 58. Vcc layers 304 and 306 connect the thin-film channel regions to the active regions 310' and 310, respectively. Vcc layer 304 and 306 together with the buried contacts underlying shared-gate electrodes 122 completes nodes 50 and 48, respectively. Vcc layers 304 and 308 form drain regions for the thin-film transistors. Vcc layers 300 and 302 form source regions of thin-film transistors 42 and 46 at Vcc tabs 301 and 303. The Vcc interconnect fabrication process is substantially the same as previously described in relation to FIG. 16.

Thus it is apparent that there has been provided, in accordance with the invention, a thin-film transistor which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various fabrication processes can be used such as X-ray lithography, molecular beam epitaxy, down-stream etching, and the like, to form the structural components of the invention. It is therefore intended to include within the invention all such variations and modifications as fall within the scope of the appended claims and equivalents thereof.

I claim:
1. A thin-film transistor comprising:
a multi-layered insulating structure overlying a substrate and having a substantially vertical side, wherein the multi-layered insulating structure includes a channel spacing layer;
a recess in the substantially vertical side, wherein the channel spacing layer is withdrawn from the vertical side and forms an inner wall of the recess;
a thin-film channel region residing substantially within the recess;
thin-film source and drain regions electrically connected to the thin-film channel region; and
a gate electrode intermediate to the source and drain regions and separated from the thin-film channel region by a gate dielectric layer.
2. The device of claim 1, wherein the thin-film source and drain regions are each comprised of a semiconductor layer, and wherein the thin-film drain region overlies a first portion of the vertical side and the thin-film source region overlies a second portion of the vertical side.
3. A thin-film transistor comprising:
a multi-layered insulating structure overlying a substrate and having a substantially vertical side, wherein the multi-layered insulating structure includes,
a first insulating layer,
a second insulating layer, and
a third insulating layer intermediate to the first and second insulating layers,
wherein the third insulating layer is withdrawn from the side of the multi-layered insulating structure;
a recess in the substantially vertical side,
wherein a portion of the third insulating layer forms an inner wall of the recess;
a thin-film channel region residing substantially within the recess;
thin-film source and drain regions electrically connected to the thin-film channel region; and
a gate electrode intermediate to the source and drain regions and separated from the thin-film channel region by a gate dielectric layer.
4. A thin-film transistor comprising:
a multi-layered insulating structure overlying a substrate and having a substantially vertical side;
a recess in the substantially vertical side;
a thin-film channel region residing substantially within the recess;
thin-film source and drain regions electrically connected to the thin-film channel region,
wherein the thin-film drain region resides in the recess and is comprised of a semiconductor layer, and wherein the thin-film source region overlies a portion of the vertical side; and
a gate electrode intermediate to the source and drain regions and separated from the thin-film channel region by a gate dielectric layer.
5. A thin-film transistor electrically coupled to bulk transistor comprising:
a semiconductor substrate having a gate dielectric layer thereon;
an opening in the gate dielectric layer exposing a contact region in the substrate;
a driver gate electrode overlying the gate dielectric layer and overlying a first portion of the contact region;
a multi-layered insulating structure overlying the driver gate electrode, the multi-layered insulating structure having a substantially vertical side;
a recess in the substantially vertical side;
a thin-film channel region residing within the recess;
a thin-film drain region overlying a portion of the vertical side and electrically contacting the thin-film channel region; and
a thin-film gate electrode overlying a portion of the multi-layered insulating structure and electrically coupling the thin-film drain region to a second portion of the contact region.
6. The device of claim 5, wherein the multi-layered insulating structure further comprises:
a first insulating layer;
a second insulating layer; and
a third insulating layer intermediate to the first and second insulating layers,
wherein the third insulating layer is withdrawn from the side of the multi-layered structure, and wherein a portion of the third insulating layer forms an inner wall of the recess.

7. The device of claim 5, wherein the thin-film channel region is polycrystalline silicon and the source and drain regions are silicon germanium.

8. A thin-film transistor comprising:
a shared-gate electrode;
a multi-layered insulating structure overlying the shared-gate electrode, wherein the multi-layered insulating structure has a substantially vertical side, and wherein the multi-layered insulating structure includes a channel spacing layer;
a recess in the substantially vertical side, wherein the channel spacing layer is withdrawn from the vertical side and forms an inner wall of the recess;
thin-film source and drain regions overlying first and second portions of the vertical side, respectively; and
a thin-film channel region residing within the recess and electrically connected to the thin-film source and drain regions, wherein the electrical conduction within the thin-film channel region is controlled by the shared-gate electrode.

9. The device of claim 8, wherein the thin-film drain region is silicon germanium and the thin-film channel region is polycrystalline silicon.

10. The device of claim 8, wherein the thin-film drain region is polycrystalline silicon and the thin-film channel region is silicon germanium.

11. The device of claim 8 further comprising:
a second gate electrode overlying the multi-layered insulating structure and electrically coupled to the shared-gate electrode by an electrically conductive layer residing in a portion of the recess.

12. A thin-film transistor comprising:
a shared-gate electrode;
a multi-layered insulating structure overlying the gate electrode, wherein the multi-layered insulating structure has a substantially vertical side,
wherein the multi-layered insulating structure further includes, a gate dielectric layer overlying the shared-gate electrode, a first insulating layer, and a second insulating layer intermediate to the first insulating layer and the gate dielectric layer,
wherein the second insulating layer is withdrawn from the side of the multi-layered body, and
wherein a portion of the second insulating layer forms an inner wall of the recess
a recess in the substantially vertical side;
thin-film source and drain regions overlying first and second portions of the vertical side, respectively; and
a thin-film channel region residing within the recess and electrically connected to the thin-film source and drain regions, wherein the electrical conduction within the thin-film channel region is controlled by the shared-gate electrode.

13. A thin-film transistor comprising:
a shared-gate electrode;
a multi-layered insulating structure overlying the gate electrode, wherein the multi-layered insulating structure has a substantially vertical side;
a recess in the substantially vertical side;
thin-film source and drain regions overlying first and second portions of the vertical side, respectively; and
a thin-film channel region residing within the recess and electrically connected to the thin-film source and drain regions,
wherein the thin-film drain region includes a lightly-doped region adjacent to the thin-film channel region, and heavily doped regions on either side of the lightly-doped region, and
wherein the electrical conduction within the thin-film channel region is controlled by the shared-gate electrode.

14. A thin-film transistor comprising:
a shared-gate electrode;
a multi-layered insulating structure overlying the gate electrode, wherein the multi-layered insulating structure has a substantially vertical side;
a recess in the substantially vertical side;
thin-film source and drain regions overlying first and second portions of the vertical side, respectively; and
a thin-film channel region residing within the recess and electrically connected to the thin-film source and drain regions,
wherein the thin-film channel region extends outward from the recess and overlies a third portion of the vertical side, and
wherein the electrical conduction within the thin-film channel region is controlled by the shared-gate electrode.

15. A thin-film transistor electrically coupled to substrate transistor comprising:
a semiconductor substrate having a gate dielectric layer thereon;
an opening in the gate dielectric layer exposing a contact region in the substrate;
a driver gate electrode overlying the gate dielectric layer;
a multi-layered insulating structure overlying the driver gate electrode, wherein a portion of the driver gate electrode is exposed by the multi-layered insulating structure;
a thin-film channel region residing within a recess in the multi-layered insulating structure;
a thin-film drain region integral with the thin-film channel region; and
a thin-film gate electrode overlying the contact region, the thin-film drain region, the exposed portion of the first gate electrode and extending beneath the thin-film drain region and a portion of the first gate electrode, wherein the thin-film gate electrode electrically couples the thin-film drain region and the driver gate electrode to the contact region.

16. A thin-film transistor electrically coupled to a substrate transistor within a memory cell comprising:
a substrate having first and second active regions therein;
a shared-gate electrode overlying the first active region and electrically contacting the second active region;
a multi-layered insulating structure overlying the shared-gate electrode, wherein the multi-layered insulating structure has a substantially vertical side;
a recess in the substantially vertical side;
a thin-film channel region residing within the recess; and
a thin-film drain region overlying a first portion of the multi-layered insulating structure and electrically coupling a first portion of the thin-film channel region to the first active region.

17. The thin-film transistor of claim 16 further comprising a Vcc interconnect layer overlying a second portion multi-layered insulating structure and electrically coupled to a second portion of the thin-film channel region, wherein a portion of the Vcc interconnect layer functions as a thin-film source region of the thin-film transistor.

* * * * *